United States Patent
Huang et al.

(10) Patent No.: US 9,202,974 B2
(45) Date of Patent: Dec. 1, 2015

(54) DOUBLE-SIDED LED AND FABRICATION METHOD THEREOF

(71) Applicant: XIAMEN SANAN OPTOELECTRONICS TECHNOLOGY CO., LTD., Xiamen (CN)

(72) Inventors: Shaohua Huang, Xiamen (CN); Chih-Wei Chao, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/712,867

(22) Filed: May 14, 2015

(65) Prior Publication Data

US 2015/0249182 A1    Sep. 3, 2015

Related U.S. Application Data

(63) Continuation of application No. PCT/CN2014/070979, filed on Jan. 21, 2014.

(30) Foreign Application Priority Data

Mar. 11, 2013  (CN) .......................... 2013 1 0075360

(51) Int. Cl.
*H01L 33/08* (2010.01)
*H01L 25/075* (2006.01)
*H01L 33/00* (2010.01)
*H01L 33/32* (2010.01)
*H01L 33/36* (2010.01)
*H01L 33/62* (2010.01)

(52) U.S. Cl.
CPC ............ *H01L 33/08* (2013.01); *H01L 25/0756* (2013.01); *H01L 33/0066* (2013.01); *H01L 33/0075* (2013.01); *H01L 33/32* (2013.01); *H01L 33/36* (2013.01); *H01L 33/62* (2013.01); *H01L 33/0079* (2013.01); *H01L 2924/0002* (2013.01); *H01L 2933/0016* (2013.01); *H01L 2933/0066* (2013.01)

(58) Field of Classification Search
CPC .................. H01L 25/075; H01L 2224/73265; H01L 2224/45144; H01L 2924/01019; H01L 2924/01079; H01L 33/54; H01L 2224/48091; H01L 33/62; H01L 2924/01012; H01L 2933/0091
See application file for complete search history.

(56) References Cited

U.S. PATENT DOCUMENTS

| | | | |
|---|---|---|---|
| 2008/0035935 A1* | 2/2008 | Shum ................... | H01L 33/382 257/79 |
| 2009/0108268 A1* | 4/2009 | Sung ..................... | F21K 9/00 257/88 |
| 2013/0182432 A1* | 7/2013 | Yoo ...................... | F21V 19/001 362/235 |
| 2015/0048390 A1* | 2/2015 | Imazu ................... | H01L 25/0756 257/88 |

FOREIGN PATENT DOCUMENTS

JP    2005347677 A    12/2005

* cited by examiner

*Primary Examiner* — Jae Lee
*Assistant Examiner* — Mohammed R Alam
(74) *Attorney, Agent, or Firm* — Syncoda LLC; Feng Ma (57) ABSTRACT

A double-sided LED has a double-sided light emitting structure formed by electroplating or electrocasting without the need for wire bonding. The double-sided light emitting gives the chip a light-emitting angle of 150 degrees or higher. In addition, the device has good light extraction and heat dissipation characteristics.

19 Claims, 7 Drawing Sheets

DOUBLE-SIDED LED AND FABRICATION METHOD THEREOF

CROSS-REFERENCE TO RELATED APPLICATIONS

The present application is a continuation of, and claims priority to, PCT/CN2014/070979 filed on Jan. 21, 2014, which claims priority to Chinese Patent Application No. 201310075360.3 filed on Mar. 11, 2013. The disclosures of these applications are hereby incorporated by reference in their entirety.

BACKGROUND

Owing to its low power consumption, long service life and high reliability, LED is generally recognized in various fields of daily life and widely applied in electronic products, e.g., serving as indicators in circuits and instruments and back light of displays.

Chinese Patent CN101110460A discloses a LED epitaxial crystallization technology, in which, the LED is formed over two sides of a transparent substrate or with two LED epitaxial wafer layers, which have same or different structures and components. Therefore, the LED formed through epitaxial crystallization can produce same or different colored lights. The stack method in such patent mixes lights for LED chips of different wavelengths and belongs to single-side light emitting, which requires further wire bonding and cannot realize large-angle light emitting status.

Many lamps are to be designed with omni-directional light emitting angle, generally realized by a GaN-based structure over the sapphire substrate. Though transparent, non-conducting and poor dissipation have restricted usage of the sapphire. An omni-directional light source has to be made through packaging design. Besides, in illuminating bulbs, a dissipation module for LED dissipation makes it more difficult to fabricate omni-directional lamps.

SUMMARY

The present disclosure provides a double-sided LED and fabrication method thereof, which forms a double-sided light emitting structure through electroplating or electrocasting instead of wire bonding. And the double-sided light emitting gives the chip a light-emitting angle of 150 degrees or above. In addition, this disclosure provides dual-sided light source requiring no wire bonding and has good light extraction and dissipation functions.

An LED comprising: a metal substrate, divided into a first conduction region and a second conduction region; an insulating structure that runs through the metal substrate and extends towards two sides to separate the first conduction region and the second conduction region of the metal substrate;

A first light-emitting epitaxial laminated layer over front surface of the metal substrate, comprising at least a first semiconductor layer and a second semiconductor layer from up to bottom, which constitute a PN junction, in which, the first semiconductor layer connects to the first conduction region and the second semiconductor layer connects to the second conduction region; a second light-emitting epitaxial laminated layer over back surface of the metal substrate, comprising at least a third semiconductor layer and a fourth semiconductor layer from bottom to up, which constitute a PN junction, in which, the third semiconductor layer connects to the first conduction region and the fourth semiconductor layer connects to the second conduction region; a gapless junction is made between the first and second light-emitting epitaxial laminated layers and the metal substrate through an insulating structure; after the first conduction region and the second conduction region are energized, current flows at the same time into the first light-emitting epitaxial laminated layer and the second light-emitting epitaxial laminated layer, thus realizing double-sided light emitting from the front and back sides of the metal substrate.

Further, the double-sided LED structure also comprises metal contact layers, formed over surfaces of the first semiconductor layer, the second semiconductor layer, the third semiconductor layer and the fourth semiconductor layer respectively, in which, the lower surfaces of the metal contact layers over surfaces of the first semiconductor layer and the second semiconductor layer are on the same level surface, and the upper surfaces of the metal contact layers over surfaces of the third semiconductor layer and the fourth semiconductor layer are also on the same level surface.

Further, the metal substrate is formed through electroplating or electrocasting.

Further, the metal substrate is made of any one of Cu, Mo, CuW, Ni and Co or their combinations.

Further, the insulating structure runs through the metal substrate and extends towards two sides to the first semiconductor layer of the first light-emitting epitaxial laminated layer and the third semiconductor layer of the second light-emitting epitaxial laminated layer.

Further, the first semiconductor layer and the third semiconductor layer are P-type conduction, and the second semiconductor layer and the fourth semiconductor layer are N-type conduction.

Further, the first semiconductor layer and the fourth semiconductor layer are N-type conduction, and the second semiconductor layer and the third semiconductor layer are P-type conduction.

Further, the first semiconductor layer and the third semiconductor layer are N-type conduction, and the second semiconductor layer and the fourth semiconductor layer are P-type conduction.

Further, the first semiconductor layer and the fourth semiconductor layer are P-type conduction, and the second semiconductor layer and the third semiconductor layer are N-type conduction.

A fabrication method of the double-sided LED of the present disclosure, comprising: 1) providing two light-emitting epitaxial laminated layers, wherein, the first light-emitting epitaxial laminated layer comprises at least a first semiconductor layer and a second semiconductor layer from up to bottom, which constitute a PN junction, and the second light-emitting epitaxial laminated layer comprises at least a third semiconductor layer and a fourth semiconductor layer from bottom to up, which constitute a PN junction 2) patterning surfaces of the two light-emitting epitaxial laminated layers respectively, wherein, surface of the first light-emitting epitaxial laminated layer is divided into a first electrode region, a second electrode region and an isolation region, and surface of the second light-emitting epitaxial laminated layer is divided into a third electrode region, a fourth electrode region and an isolation region; 3) fabricating the metal contact layers in electrode regions of the two light-emitting epitaxial laminated layers respectively, guaranteeing that the metal contact layers of same light-emitting epitaxial laminated layer are on a same level surface; 4) fabricating an insulating structure over the isolation region of the first or/and the second light-emitting epitaxial laminated layer, the surface of which is higher than the metal contact layer surface; 5) placing the two light-emitting epitaxial laminated layers in a parallel and symmetric way and forming a metal substrate between the two light-emitting epitaxial laminated layers through electroplating or electrocasting with no gap, wherein, the insulating structure runs through the metal substrate and divides the metal substrate into first and second conduction regions, in which, the first semiconductor layer connects to the first conduction region; the second semiconductor layer connects to the second conduction region; the third semiconductor layer connects to the first conduction region; and the fourth semiconductor layer connects to the second conduction region.

In the present disclosure, the metal substrate can be made of any one of Cu, Mo, CuW, Ni and Co or their combinations; the growth substrate is made of either of Si, $Al_2O_3$ or their combination; the P-type metal contact layer is made of any one of ITO, Ni, Ag, Au, Al, Pt, Cr, Ti, Pd or Rh or their combinations; the N-type metal contact layer is made of any one of Cr, Al, Pt, Au, Ti, Ni or their combinations; the insulating structure is made of any one of SU8, BCB, PI or light resistance or their combinations.

Benefits of the present disclosure may include: double-sided light emitting source is realized with a single metal substrate without wire bonding for future packing process, which is more suitable for light-emitting field. When it is applied in general solid-state lighting, the ball-bulb lamps can easily achieve omni-directional light source design instead of generating multi-sided light emitting by adhering packing structures over the dual sides at packing end. A light-emitting system can be provided including a plurality of the double-sided LEDs, as well as other types of LEDs.

DETAILED DESCRIPTION

The embodiments of the present disclosure will be described with reference to the accompanying figures and embodiments.

Embodiment 1

Figure 7:
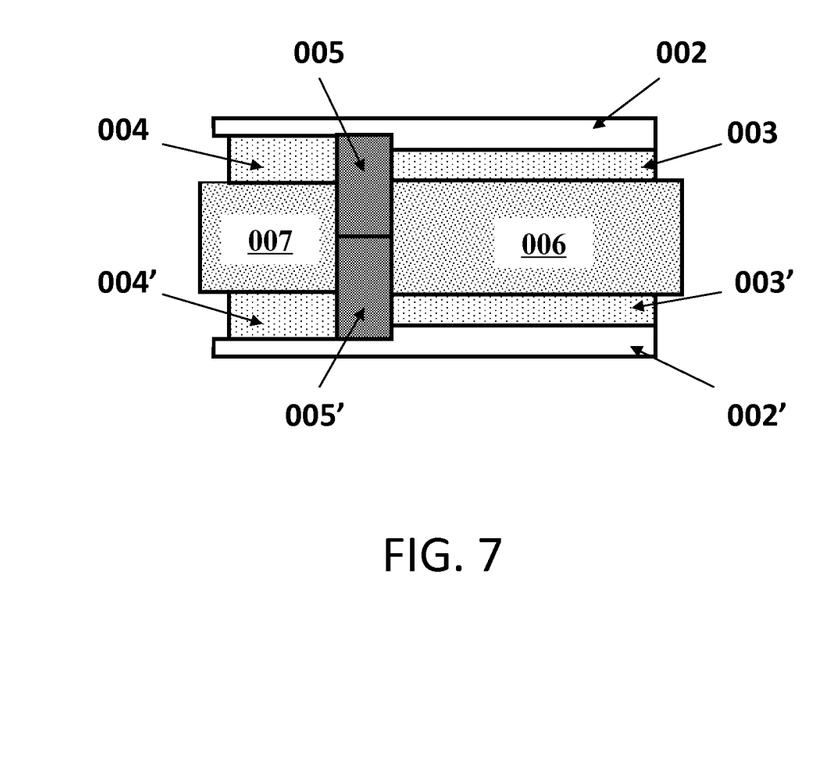
FIG. 7 is a sectional view of a seventh step of a fabrication method according to some embodiments.

As shown in FIG. 7, a double-sided LED structure of this embodiment, comprising a metal substrate, insulating structures 005 and 005', a first light-emitting epitaxial laminated layer 002, a second light-emitting epitaxial laminated layer 002', P-type metal contact layers 003 and 003', N-type metal contact layers 004 and 004', wherein, a gapless junction is made between the first light-emitting epitaxial laminated layer 002 and the second light-emitting epitaxial laminated layer 002' and the metal substrate through insulating structures 005 and 005'.

Specifically, the metal substrate is divided into a first conduction region 007 and a second conduction region 006, wherein, the insulating structures 005 and 005' run through the metal substrate and extend towards two sides to separate the first conduction region 007 and the second conduction region 006 of the metal substrate. A first light-emitting epitaxial laminated layer 002 is over front surface of the metal substrate, comprising at least a first semiconductor layer and a second semiconductor layer from up to bottom, which constitute a PN junction. A second light-emitting epitaxial laminated layer 002' is over back surface of the metal substrate, comprising at least a third semiconductor layer and a fourth semiconductor layer from bottom to up, which constitute a PN junction. The P-type metal contact layers 003 and 003' form over surfaces of the second semiconductor layer and the fourth semiconductor layer, and the N-type metal contact layers 004 and 004' form over surfaces of the first semiconductor layer and the fourth semiconductor layer respectively, wherein, bottom surfaces of the P-type metal contact layer 003 and the N-type metal contact layer 004 are on a same level surface, and upper surfaces of the P-type metal contact layer 003' and the N-type metal contact layer 004' are on a same level surface.

In this double-sided LED structure, the first semiconductor layer connects to the first conduction region 007 of the metal substrate through the N-type metal contact layer 004; the second semiconductor layer connects to the second conduction region 006 of the metal substrate through the P-type metal contact layer 003; the third semiconductor layer connects to the first conduction region 007 of the metal substrate through the N-type metal contact layer 004'; and the fourth semiconductor layer connects to the P-type metal contact layer 003' of the metal substrate through the second conduction region 006. After the first conduction region 007 and the second conduction region 006 are energized, current at the same time flows into the first light-emitting epitaxial laminated layer and the second light-emitting epitaxial laminated layer, thus realizing double-sided light emitting from the front and back sides of the metal substrate.

A detailed description will be given to the above structure in combination with fabrication methods.

Figure 1:
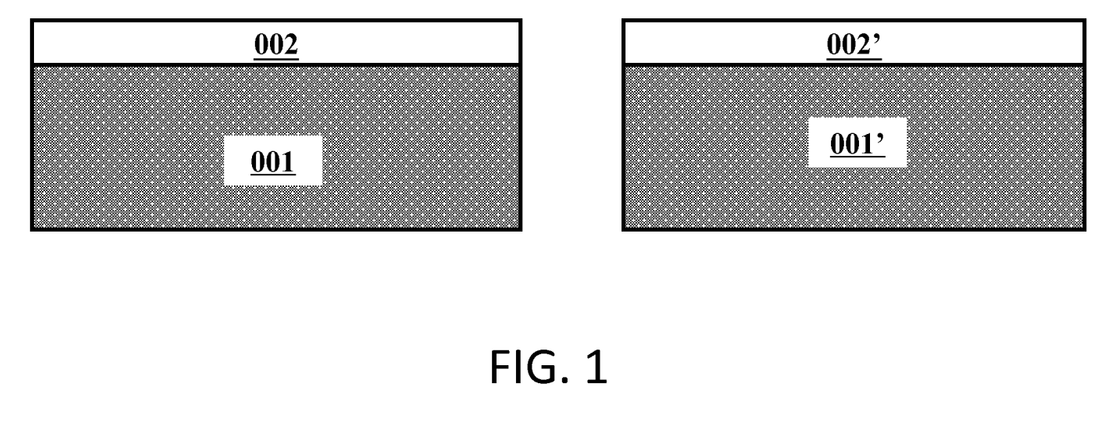
FIG. 1 is a sectional view of a first step of a fabrication method according to some embodiments.

A fabrication method of LED, comprising:

As shown in FIG. 1, taking a first InGaN/GaN-based light-emitting epitaxial laminated layer 002 and a second light-emitting epitaxial laminated layer 002' grown over the sapphire ($Al_2O_3$) substrates 001 and 001', wherein, the light-emitting epitaxial laminated layer 002 comprises successively a first semiconductor layer (an N-type semiconductor layer), an active layer and a second semiconductor layer (a P-type semiconductor layer), and the light-emitting epitaxial laminated layer 002' comprises successively a third semiconductor layer (an N-type semiconductor layer), an active layer and a fourth semiconductor layer (a P-type semiconductor layer).

Figure 2:
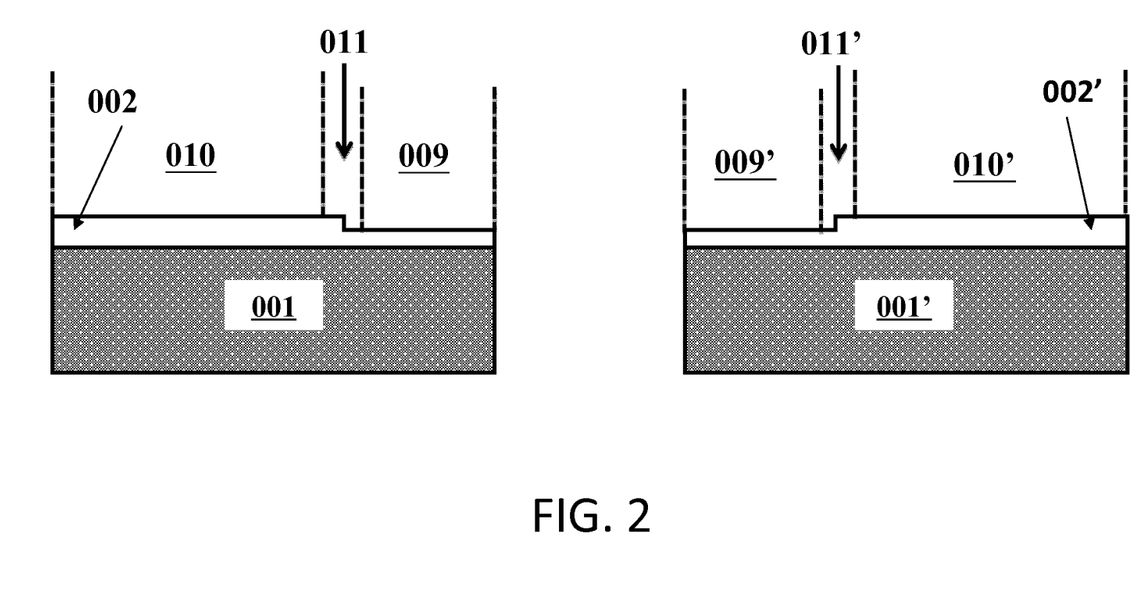
FIG. 2 is a sectional view of a second step of a fabrication method according to some embodiments.

As shown in FIG. 2, patterning surfaces of the two light-emitting epitaxial laminated layers through yellow light and etching respectively, wherein, surface of the first light-emitting epitaxial laminated layer 002 is divided into a first electrode region 009, a second electrode region 010 and an isolation region 011, and surface of the second light-emitting epitaxial laminated layer 002' is divided into a third electrode region 009', a fourth electrode region 010' and an isolation region 011'.

Figure 3:
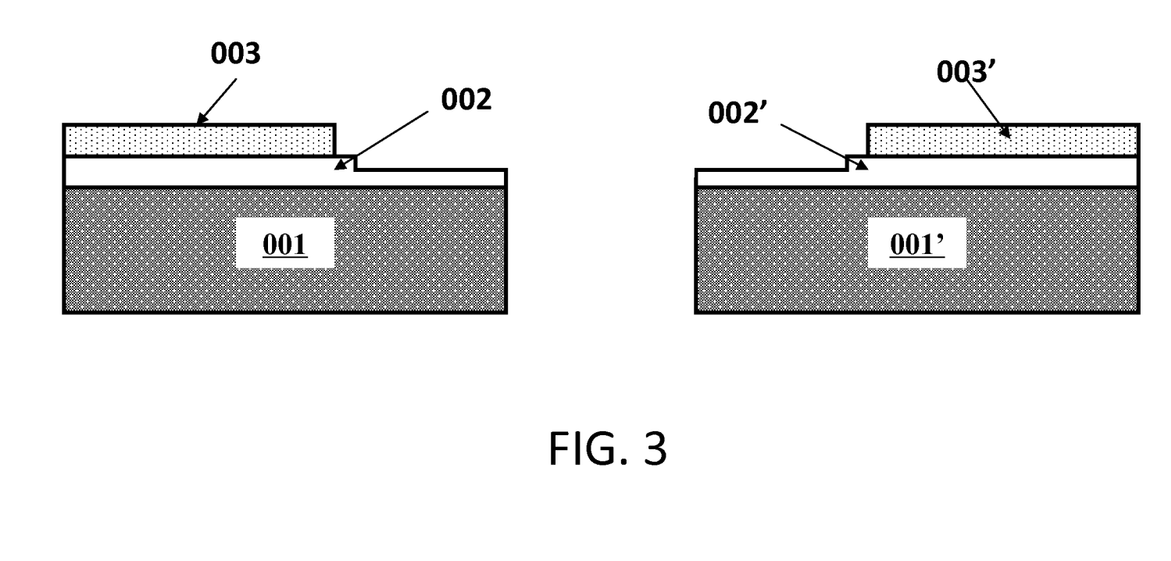
FIG. 3 is a sectional view of a third step of a fabrication method according to some embodiments.

As shown in FIG. 3, evaporating P-type contact metals 003 and 003' made of Cr/Pt/Au in the second electrode region 010 on surface of the first light-emitting epitaxial laminated layer 002 and in the fourth electrode region 010' on surface of the second light-emitting epitaxial laminated layer 002' respectively through yellow light and coating.

Figure 4:
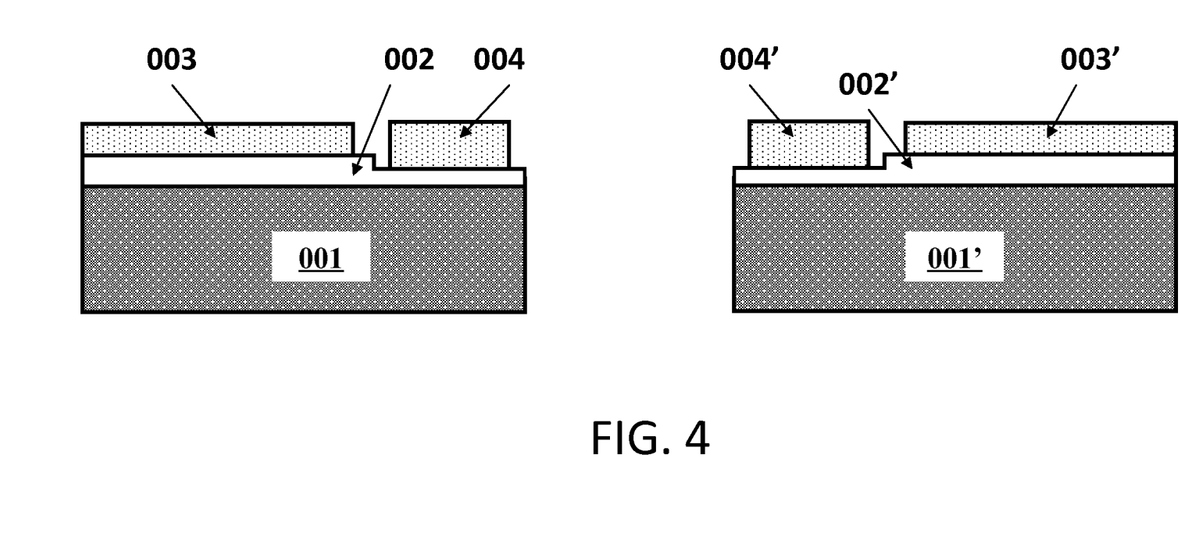
FIG. 4 is a sectional view of a fourth step of a fabrication method according to some embodiments.

As shown in FIG. 4, evaporating N-type contact metals 004 and 004' made of Al/Ti/Pt/Au in the first electrode region 009 on surface of the first light-emitting epitaxial laminated layer 002 and in the third electrode region 009' on surface of the second light-emitting epitaxial laminated layer 002' respectively through yellow light and coating to enable that the N-type contact metal 004 and the P-type contact metal 003 are on the same level surface, and the N-type contact metal 004' and the P-type contact metal 003' are on the same level surface.

Figure 5:
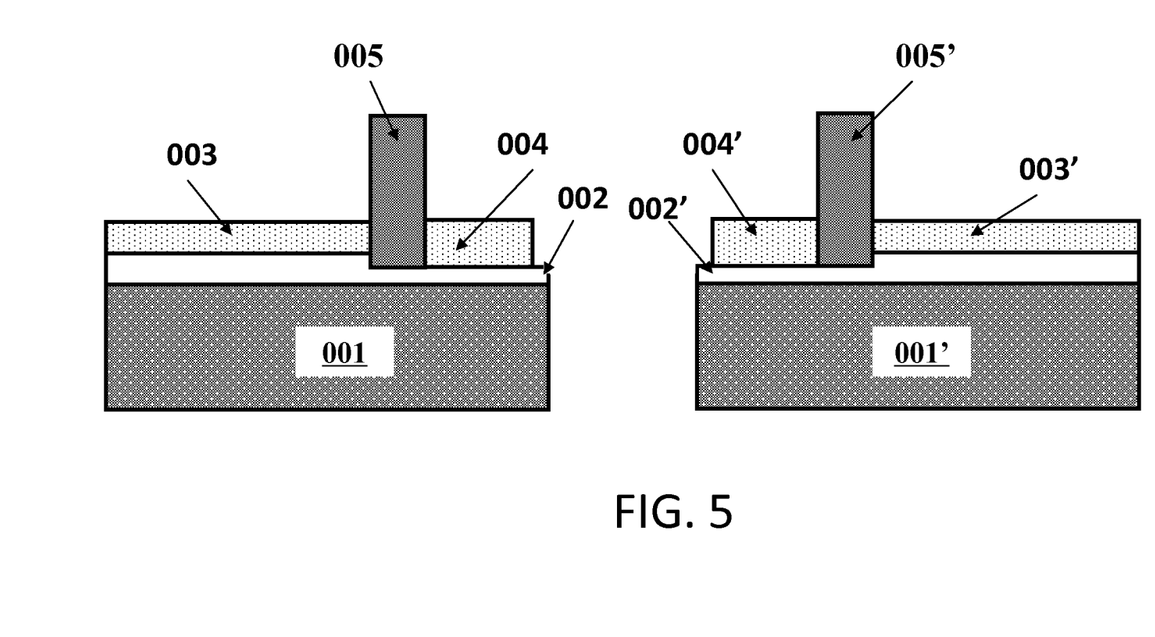
FIG. 5 is a sectional view of a fifth step of a fabrication method according to some embodiments.

As shown in FIG. 5, fabricating insulating structures 005 and 005' made of BCB in the isolation regions on surfaces of the first and second light-emitting epitaxial laminated layers through filling, the surface of which is higher than surfaces of the P-type contact metals 003 and 003'.

Figure 6:
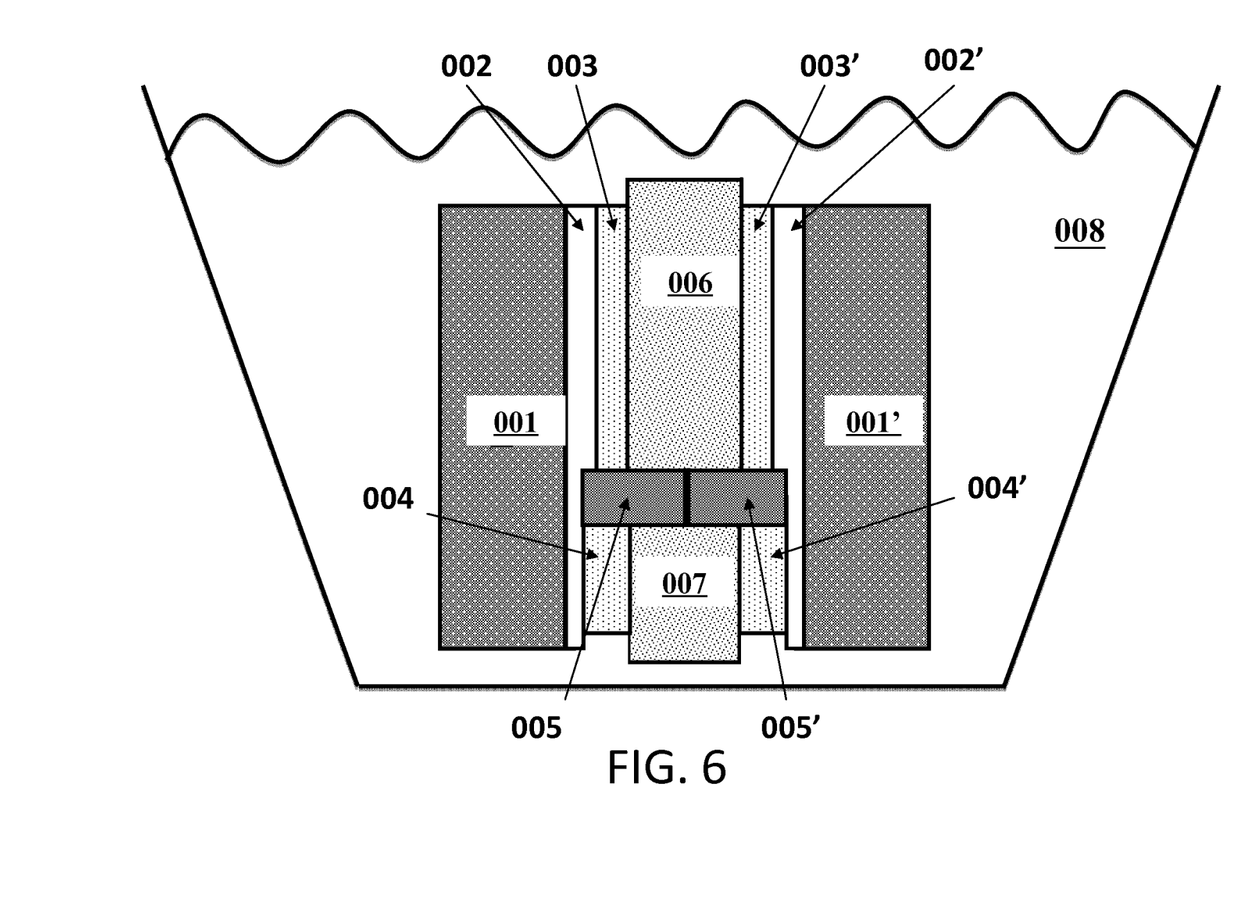
FIG. 6 is a sectional view of a sixth step of a fabrication method according to some embodiments.

As shown in FIG. 6, placing the two light-emitting epitaxial laminated layers 002 and 002' in a parallel and symmetric way and forming a Cu metal substrate between the two light-emitting epitaxial laminated layers with no gap through electroplating, wherein, the BCB insulating structure runs through the metal substrate and divides the metal substrate into a first conduction region 007 and a second conduction region 006, in which, the first semiconductor layer connects to the first conduction region 007 through the N-type metal contact layer 004; the second semiconductor layer connects to the second conduction region 006 through the P-type metal contact layer 003; the third semiconductor layer connects to the first conduction region 007 through the N-type metal contact layer 004'; and the fourth semiconductor layer connects to the second conduction region 006 through the P-type metal contact layer 003'. To ensure no gap between insulating structures, it is allowed to have little compression for the insulating structure after para-position, to avoid short circuit between the first conduction region 007 and the second conduction region 006 over the metal substrate.

As shown in FIG. 7, removing the two sapphire growth substrates 001 exposed at the outermost layer to expose the two light-emitting epitaxial laminated layers 002 and 002'. Specifically, expose the first semiconductor layer (the N-type semiconductor layer) and the third semiconductor layer (the N-type semiconductor layer). Roughening or regular patterns can be fabricated over the N-type semiconductor layer through etching or grinding to increase light extraction efficiency. After further positioning and cutting for grain patters, a LED of double-sided light extraction can be obtained.

The chip structure of double-sided light extraction fabricated as above has a light-emitting angle of 150 degrees or above requiring no future wire bonding In addition, it has good light extraction and dissipation functions.

Embodiment 2

Different from Embodiment 1, in the vertical LED of double-sided light emitting of this embodiment, the first light-emitting epitaxial laminated layer comprises successively a first semiconductor layer (an N-type semiconductor layer), an active layer and a second semiconductor layer (a P-type semiconductor layer), and the second light-emitting epitaxial laminated layer comprises successively a third semiconductor layer (a P-type semiconductor layer), an active layer and a fourth semiconductor layer (an N-type semiconductor layer); accordingly, the first semiconductor layer (the N-type semiconductor layer) connects to the first conduction region through the N-type metal contact layer, the second semiconductor layer (the P-type semiconductor layer) connects to the second conduction region through the P-type metal contact layer; the third semiconductor layer (the P-type semiconductor layer) connects to the first conduction region through the P-type metal contact layer; and the fourth semiconductor layer (the N-type semiconductor layer) connects to the second conduction region through the N-type metal contact layer. In this way, after the first conduction region and the second conduction region are energized, current also flows into the two light-emitting epitaxial laminated layers; the first light-emitting epitaxial laminated layer and the second light-emitting epitaxial laminated layer are electronically connected through inversely-parallel connection and constitute an AC-LED, thereby realizing alternative light emitting at front and back sides of the metal substrate.

Embodiment 3

Different from Embodiment 1, in the vertical LED of double-sided light emitting of this embodiment, while fabricating the insulating structure, only a thick insulating structure is fabricated in the isolation region on one of the light-emitting epitaxial laminated layers and the isolation region of the other light-emitting epitaxial laminated layer has no insulating structure. In this way, after parallel placement and para-positioning of the two light-emitting epitaxial laminated layers, the single insulating structure can run through the metal substrate and a gapless structure can be formed between the two light-emitting epitaxial laminated layers and the metal substrate.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A double-sided LED, comprising: a metal substrate including a first conduction region and a second conduction region; an insulating structure through the metal substrate and extending towards two sides of the metal substrate to separate the first conduction region and the second conduction region; a first light-emitting epitaxial laminated layer over a front surface of the metal substrate, comprising at least a first semiconductor layer and a second semiconductor layer from up to bottom forming a PN junction, wherein the first semiconductor layer is coupled to the first conduction region and the second semiconductor layer is coupled to the second conduction region; a second light-emitting epitaxial laminated layer over a back surface of the metal substrate, comprising at least a third semiconductor layer and a fourth semiconductor layer from bottom to up forming a PN junction, wherein the third semiconductor layer is coupled to the first conduction region and the fourth semiconductor layer is coupled to the second conduction region; a gapless junction formed between the first and second light-emitting epitaxial laminated layers and the metal substrate through the insulating structure; wherein the double-sided LED is configured such that if the first conduction region and the second conduction region are coupled to electricity, an electrical current flows substantially simultaneously into the first light-emitting epitaxial laminated layer and the second light-emitting epitaxial laminated layer, thereby realizing double-sided light emitting from the front and back surfaces of the metal substrate.

2. The double-sided LED of claim 1, wherein the metal substrate is formed through electroplating or electrocasting.

3. The double-sided LED of claim 2, wherein the metal substrate comprises at least one of Cu, Mo, CuW, Ni, or Co.

4. The double-sided LED of claim 1, wherein the insulating structure is through the metal substrate and extends towards two sides to the first semiconductor layer of the first light-emitting epitaxial laminated layer and the third semiconductor layer of the second light-emitting epitaxial laminated layer.

5. The double-sided LED of claim 4, wherein the insulating structure comprises at least one of SU8, BCB, PI, or a light resistance.

6. The double-sided LED of claim 1, further comprising metal contact layers formed over surfaces of the first semiconductor layer, the second semiconductor layer, the third semiconductor layer, and the fourth semiconductor layer, respectively, wherein lower surfaces of the metal contact layers over surfaces of the first semiconductor layer and the second semiconductor layer are at a same level surface, and upper surfaces of the metal contact layers over surfaces of the third semiconductor layer and the fourth semiconductor layer are also at a same level surface.

7. The double-sided LED of claim 1, wherein the first semiconductor layer and the third semiconductor layer are first-type semiconductor layers, and the second semiconductor layer and the fourth semiconductor layer are second-type semiconductor layers.

8. The double-sided LED of claim 7, wherein if the first-type semiconductor layers are N-type semiconductor layers, then the second-type semiconductor layer are P-type semiconductor layers; if the first-type semiconductor layers are P-type semiconductor layers, then the second-type semiconductor layers are N-type semiconductor layers.

9. The double-sided LED of claim 1, wherein the first semiconductor layer and the fourth semiconductor layer are first-type semiconductor layers, and the second semiconductor layer and the third semiconductor layer are second-type semiconductor layers.

10. The double-sided LED of claim 9, wherein if the first-type semiconductor layers are N-type semiconductor layers, then the second-type semiconductor layer are P-type semiconductor layers; if the first-type semiconductor layers are P-type semiconductor layers, then the second-type semiconductor layers are N-type semiconductor layers.

11. A fabrication method of a double-sided LED, comprising:
1) providing a first and a second light-emitting epitaxial laminated layers, wherein the first light-emitting epitaxial laminated layer comprises at least a first semiconductor layer and a second semiconductor layer from up to bottom forming a PN junction, and the second light-emitting epitaxial laminated layer comprises at least a third semiconductor layer and a fourth semiconductor layer from bottom to up forming a PN junction;
2) patterning surfaces of the first and second light-emitting epitaxial laminated layers respectively, wherein a surface of the first light-emitting epitaxial laminated layer is divided into a first electrode region, a second electrode region, and an isolation region, and a surface of the second light-emitting epitaxial laminated layer is divided into a third electrode region, a fourth electrode region, and another isolation region;
3) fabricating metal contact layers in electrode regions of the two light-emitting epitaxial laminated layers respectively, wherein the metal contact layers of same light-emitting epitaxial laminated layer are at a same level surface;
4) fabricating an insulating structure over the isolation region of the first or/and the second light-emitting epitaxial laminated layer, wherein the insulating structure has a surface higher than the metal contact layer surface;
5) disposing the two light-emitting epitaxial laminated layers in a parallel and symmetric configuration and forming gaplessly a metal substrate between the two light-emitting epitaxial laminated layers through electroplating or electrocasting, wherein the insulating structure is through the metal substrate and divides the metal substrate into first and second conduction regions, wherein the first semiconductor layer connects to the first conduction region, the second semiconductor layer connects to the second conduction region, the third semiconductor layer connects to the first conduction region; and the fourth semiconductor layer connects to the second conduction region.

12. A light-emitting system comprising a plurality of double-sided LEDs, each LED comprising: a metal substrate including a first conduction region and a second conduction region; an insulating structure through the metal substrate and extending towards two sides of the metal substrate to separate the first conduction region and the second conduction region; a first light-emitting epitaxial laminated layer over a front surface of the metal substrate, comprising at least a first semiconductor layer and a second semiconductor layer from up to bottom forming a PN junction, wherein the first semiconductor layer is coupled to the first conduction region and the second semiconductor layer is coupled to the second conduction region; a second light-emitting epitaxial laminated layer over a back surface of the metal substrate, comprising at least a third semiconductor layer and a fourth semiconductor layer from bottom to up forming a PN junction, wherein the third semiconductor layer is coupled to the first conduction region and the fourth semiconductor layer is coupled to the second conduction region; a gapless junction formed between the first and second light-emitting epitaxial laminated layers and the metal substrate through the insulating structure; wherein the LED is configured such that if the first conduction region and the second conduction region are coupled to electricity, an electrical current flows substantially simultaneously into the first light-emitting epitaxial laminated layer and the second light-emitting epitaxial laminated layer, thereby realizing double-sided light emitting from the front and back surfaces of the metal substrate.

13. The system of claim 12, wherein the metal substrate is formed through electroplating or electrocasting.

14. The system of claim 13, wherein the metal substrate comprises at least one of Cu, Mo, CuW, Ni, or Co.

15. The system of claim 12, wherein the insulating structure is through the metal substrate and extends towards two sides to the first semiconductor layer of the first light-emitting epitaxial laminated layer and the third semiconductor layer of the second light-emitting epitaxial laminated layer.

16. The system of claim 15, wherein the insulating structure comprises at least one of SU8, BCB, PI, or a light resistance.

17. The system of claim 12, each LED further comprising metal contact layers formed over surfaces of the first semiconductor layer, the second semiconductor layer, the third semiconductor layer, and the fourth semiconductor layer, respectively, wherein lower surfaces of the metal contact layers over surfaces of the first semiconductor layer and the second semiconductor layer are at a same level surface, and upper surfaces of the metal contact layers over surfaces of the third semiconductor layer and the fourth semiconductor layer are also at a same level surface.

18. The system of claim 12, wherein the first semiconductor layer and the third semiconductor layer are first-type semiconductor layers, and the second semiconductor layer and the fourth semiconductor layer are second-type semiconductor layers, or the first semiconductor layer and the fourth semiconductor layer are first-type semiconductor layers, and the second semiconductor layer and the third semiconductor layer are second-type semiconductor layers.

19. The system of claim 18, wherein the first-type and the second-type are different types between N-type and P-type.

* * * * *